United States Patent
Morishima

(10) Patent No.: US 6,865,129 B2
(45) Date of Patent: Mar. 8, 2005

(54) DIFFERENTIAL AMPLIFIER CIRCUIT WITH HIGH AMPLIFICATION FACTOR AND SEMICONDUCTOR MEMORY DEVICE USING THE DIFFERENTIAL AMPLIFIER CIRCUIT

(75) Inventor: Chikayoshi Morishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/442,978

(22) Filed: May 22, 2003

(65) Prior Publication Data

US 2004/0017717 A1 Jan. 29, 2004

(30) Foreign Application Priority Data

Jul. 24, 2002 (JP) ........................................ 2002-215137

(51) Int. Cl.$^7$ .............................. G11C 7/00; G11C 7/02; G11C 11/00
(52) U.S. Cl. ........................ 365/205; 365/207; 365/214; 365/154
(58) Field of Search ................................ 365/207, 205, 365/214

(56) References Cited

U.S. PATENT DOCUMENTS

| | | | | | |
|---|---|---|---|---|---|
| 4,893,090 | A | * | 1/1990 | Boudewijns | ................ 330/253 |
| 5,493,253 | A | * | 2/1996 | Ogou | ......................... 330/256 |
| 5,859,806 | A | * | 1/1999 | Wada | ......................... 365/207 |
| 6,225,834 | B1 | * | 5/2001 | Gang | ........................... 327/55 |
| 6,292,418 | B1 | * | 9/2001 | Kawashima et al. | ........ 365/205 |
| 6,295,241 | B1 | * | 9/2001 | Watanabe et al. | ........... 365/208 |
| 6,424,571 | B1 | * | 7/2002 | Pekny | .................. 365/185.21 |
| 6,483,353 | B2 | * | 11/2002 | Kim et al. | ..................... 327/55 |
| 6,492,796 | B1 | * | 12/2002 | Morley | ....................... 323/316 |

FOREIGN PATENT DOCUMENTS

JP          07-230694 A          8/1995

\* cited by examiner

*Primary Examiner*—David Nelms
*Assistant Examiner*—Lý Duy Pham
(74) *Attorney, Agent, or Firm*—Burns, Doane, Swecker & Mathis, L.L.P.

(57) ABSTRACT

A differential amplifier circuit includes a pair of first and second P-type transistors and a pair of first and second enhancement-mode N-type transistors. The first and second P-type transistors have respective gates each connected to the drain of the other P-type transistor, i.e., the first and second P-type transistors are cross-coupled. To respective gates of the first and second N-type transistors, a constant voltage VG ($Vth \leq VG \leq Vdd$) is applied. Currents of different magnitudes respectively are applied to first and second input terminals and the first and second N-type transistors generate voltages on first and second output terminals respectively, according to respective currents flowing through the first and second N-type transistors. The differential amplifier circuit is employed as a sense amplifier of a semiconductor memory device for use in reading data.

6 Claims, 9 Drawing Sheets

| T | WEC | CT1 | CT2 | CT3 |
|---|---|---|---|---|
| L | L | L | H | L |
| L | H | L | H | L |
| H | L | L | H | H |
| H | H | H | L($\sim \Delta t$), H($\Delta t \sim$) | L | ered for example in Japanese Patent Laying-Open No. 7-230694.
DIFFERENTIAL AMPLIFIER CIRCUIT WITH HIGH AMPLIFICATION FACTOR AND SEMICONDUCTOR MEMORY DEVICE USING THE DIFFERENTIAL AMPLIFIER CIRCUIT

BACKGROUND OF THE INVENTION

1. Field of the Invention

The present invention relates to a differential amplifier circuit and a semiconductor memory device using the differential amplifier circuit. More specifically, the present invention relates to a configuration for increasing the amplification factor.

2. Description of the Background Art

When such a semiconductor memory device as static RAM (Random Access Memory) reads data in a memory cell, current flows through a pair of bit lines connected to that memory cell. Regarding the current flowing through the paired bit lines, one of respective currents flowing through the paired bit lines becomes larger than the other one, depending on whether the data in the memory cell has H (logical high) level and L (logical low) level. The difference in current between the paired bit lines is considerably small and thus a differential amplifier circuit is employed as a sense amplifier for amplifying such a slight difference in current between the bit lines.

One example of such a differential amplifier circuit used for the semiconductor memory device is disclosed for example in Japanese Patent Laying-Open No. 7-230694.

FIG. 13 shows a basic configuration of the differential amplifier circuit. As shown, the differential amplifier circuit includes a pair of P-channel MOS transistors (hereinafter P-type transistors) P100 and P101 and a pair of N-channel MOS transistors (hereinafter N-type transistors) N100 and N101.

P-type transistors P100 and P101 each have the gate connected to the drain of the other P-type transistor (cross-coupled). N-type transistors N100 and N101 are diode-connected.

An input terminal D is connected to the source of P-type transistor P100, and an input terminal DC is connected to the source of P-type transistor P101. An output terminal Q is connected commonly to respective drains of N-type transistor N100 and P-type transistor P100, and an output terminal QC is connected commonly to respective drains of N-type transistor N101 and P-type transistor P101.

Input terminal D and input terminal DC respectively receive current I1 and current I2. Here, it is supposed that current I1 is larger than current I2. Current I1 flows through P-type transistor P100 and N-type transistor N100 while current I2 flows through P-type transistor P101 and N-type transistor N101.

Positive feedback is performed by cross-coupled P-type transistors P100 and P101. When current I1=I flows from input terminal D and current I2=I−dI flows from input terminal DC, voltage V is generated at output terminal Q while voltage V−dV is generated at output terminal QC according to respective values of these currents. When the voltage dV is large enough, output terminal Q is identified as H level and output terminal QC is identified as L level. From respective voltage levels on the paired output terminals, whether the data in the memory cell has H level or L level is determined.

As discussed above, the conventional differential amplifier circuit is capable of amplifying a difference between supplied current values as a difference between respective voltage levels on paired output terminals. Such a differential amplifier circuit may be employed as a sense amplifier circuit of a semiconductor memory device to amplify a difference of currents flowing respectively through paired bit lines into a difference of respective voltage levels on paired output terminals so as to determine, by the amplified voltage level, whether the data in the memory cell has L level or H level.

The above-described conventional differential amplifier circuit, however, has an unsatisfactory amplification factor, i.e., the ratio of the difference dI in input current to the difference dV in output voltage.

One reason for this is from characteristics of the diode-connected N-type transistors.

FIG. 14 shows current-voltage characteristics of the diode-connected N-type transistors. Because of the steep slope of the characteristic curve as shown in FIG. 14, small difference dI in drain current results in small difference dV in drain-source voltage. Then, a small difference dI in input current results in a small difference dV in output voltage.

Suppose that the differential amplifier circuit is employed as a sense amplifier of an SRAM (Static Random Access Memory). Here, the difference in input current ranges from 0 to 100 $\mu$A, while the difference in output voltage dV for this difference in input current is approximately 30% of Vdd and is extremely small. Therefore, it is impossible to accurately determine which of the paired output terminals has L level or H level. Then, in order to determine the voltage level of the pair of output terminals, repeated positive-feedback operation by P-type transistors P100 and P101 is required, for making voltage difference dV sufficiently large, resulting in decrease in reading rate of the data from the memory cell.

SUMMARY OF THE INVENTION

One object of the present invention is to provide a differential amplifier circuit with a high amplification factor as well as a semiconductor memory device using the differential amplifier circuit.

A differential amplifier circuit according to one aspect of the present invention includes a first input terminal and a second input terminal, a first output terminal and a second output terminal, a first P-type transistor having its source connected to the first input terminal, its drain connected to the first output terminal and its gate connected to the second output terminal, a second P-type transistor having its source connected to the second input terminal, its drain connected to the second output terminal and its gate connected to the first output terminal, a first N-type transistor having its source grounded, its drain connected to the first output terminal and its gate applied with a first potential, and a second N-type transistor having its source grounded, its drain connected to the second output terminal and its gate applied with the first potential. The first potential turns on the first N-type transistor and the second N-type transistor.

A constant voltage is applied to respective gates of the first N-type transistor and the second N-type transistor, and thus the ratio of the drain current difference to the source-drain voltage difference is made higher to increase the amplification factor of this differential amplifier circuit.

According to one aspect of the present invention, a semiconductor memory device employs a differential amplifier circuit as a sense amplifier for reading data from a memory cell.

In reading data from a memory cell, a slight difference in current between paired bit lines is amplified as a large voltage difference to improve reading accuracy of data from the memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

First Embodiment

Figure 1:
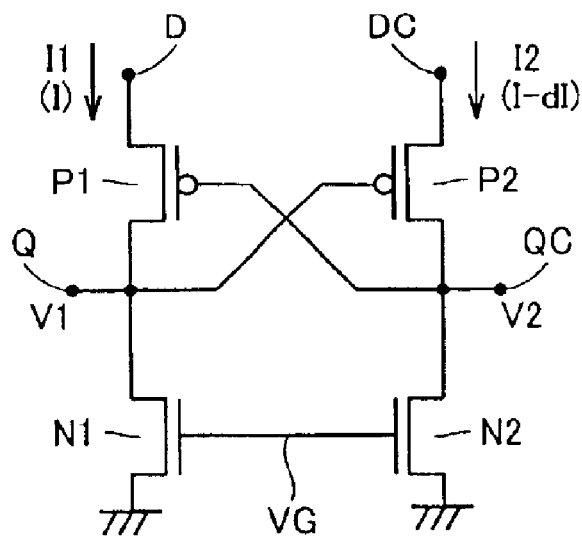
FIG. 1 shows a configuration of a differential amplifier circuit according to a first embodiment of the present invention.

A differential amplifier circuit according to a first embodiment shown in FIG. 1 is constituted of a pair of P-channel MOS transistors (hereinafter P-type transistors) P1 and P2 and a pair of N-channel MOS transistors (hereinafter N-type transistors) N1 and N2. In this embodiment, P-type transistors P1 and P2 and N-type transistors N1 and N2 are described as those of enhancement type.

P-type transistors P1 and P2 each have the gate connected to the drain of the other transistor (cross-coupled).

N-type transistors N1 and N2 characterizing this embodiment have respective sources grounded and respective gates supplied externally with a constant voltage VG (Vth≦VG≦Vdd) for allowing N-type transistors N1 and N2 to operate in ON state. Here, Vdd represents a power supply voltage of the differential amplifier circuit, and Vth represents a minimum voltage required for allowing N-type transistors N1 and N2 to be held in ON state. VG may take any value in the range described above, however, it is desirable that VG causes N-type transistors N1 and N2 to be turned on in a saturated state.

By N-type transistors N1 and N2, voltages are generated respectively at output terminals Q and QC according respectively to currents flowing through respective N-type transistors N1 and N2.

Input terminals D and DC are connected respectively to respective sources of P-type transistors P1 and P2. Output terminal Q is connected commonly to respective drains of N-type transistor N1 and P-type transistor P1 while output terminal QC is connected commonly to respective drains of N-type transistor N2 and P-type transistor P2.

The differential amplifier circuit operates as described below.

Current I1 and current I2 are supplied respectively to input terminal D and input terminal DC. It is supposed here that current I1 is larger than current I2.

Current I1 flows through P-type transistor P1 and N-type transistor N1 while current I2 flows through P-type transistor P2 and N-type transistor N2. As current I1 flowing through N-type transistor N1 is larger than current I2 flowing through N-type transistor N2, voltage V1 on output terminal Q is accordingly larger than voltage V2 on output terminal QC.

Here, the larger voltage V1 on output terminal Q that is applied to the gate of P-type transistor P2 decreases the drive power of P-type transistor P2 due to the positive feedback operation, resulting in still smaller current I2.

On the other hand, the smaller voltage V2 on output terminal QC that is applied to the gate of P-type transistor P1 increases the drive power of P-type transistor P1 because of the positive feedback operation, resulting in still larger current I1.

When current I1=I flows from input terminal D and current I2=I−dI flows from input terminal DC, voltage V is generated on output terminal Q and voltage V−dV is generated on output terminal QC according respectively to respective values of the currents. As this embodiment provides a sufficiently large dV which is different from that of the conventional differential amplifier circuit discussed above, it is possible to identify output terminal Q as H level and output terminal QC as L level.

The following is a reason for increase to a required degree of dV.

Figure 2:
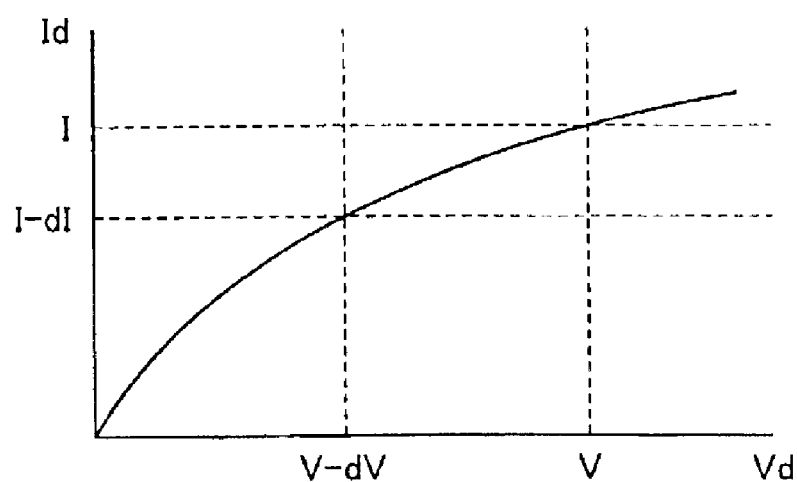
FIG. 2 shows current-voltage characteristics of N-type transistors with a fixed gate voltage.
Figure 14:
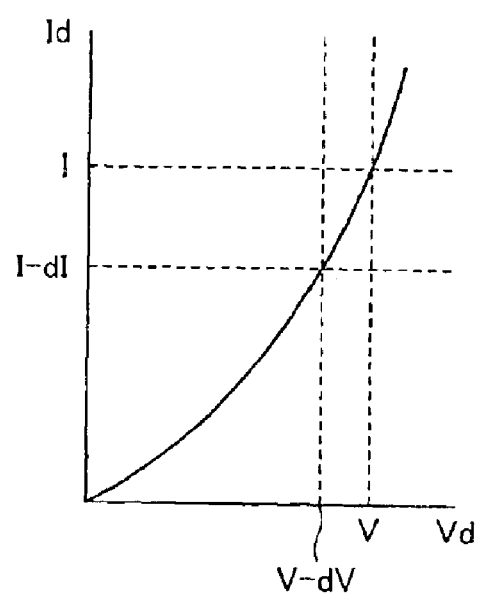
FIG. 14 shows current-voltage characteristics of diode-connected N-type transistors.

FIG. 2 shows current-voltage characteristics of N-type transistors with a fixed gate voltage. From the characteristic curve shown in FIG. 2 that has a gentler slope than that shown in FIG. 14, it is seen that difference dV in drain-source voltage Vd is greater than difference dI in drain current Id.

According to this embodiment, respective gates of N-type transistors N1 and N2 are not diode-connected but are supplied with constant voltage VG and accordingly such current-voltage characteristics as shown in FIG. 2 are provided. When this differential amplifier circuit is used as a sense amplifier of an SRAM, with respect to difference dI in input current that ranges from 0 to 100 $\mu$A, difference dV in output voltage is approximately 50% of Vdd and thus sufficiently large. It is thus accurately determined which of the paired output terminals has L or H level.

As discussed above, the amplification factor of the differential amplifier circuit of this embodiment is increased by applying a constant voltage to respective gates of N-type transistors N1 and N2.

According to this embodiment, enhancement-mode MOS transistors are employed as P-type transistors P1 and P2 and N-type transistors N1 and N2. Alternatively, depletion-mode MOS transistors may be employed as these transistors.

In particular, depletion-mode MOS transistors used for P-type transistors P1 and P2 provide an advantage as described below. For the differential amplifier circuit, increase in voltages on output terminals Q and QC at the time of amplification causes decrease in drive power of P-type transistors P1 and P2 and, consequently, amplification takes a longer time. The depletion-mode MOS transistor has a feature that the drive power thereof is greater than that of the enhancement-mode MOS transistor with respect to the same gate voltage. Then, depletion-mode transistors may be employed as the P-type transistors P1 and P2 to shorten the time required for amplification.

According to this embodiment, voltage VG applied to respective gates of N-type transistors N1 and N2 is equal to or smaller than power supply voltage Vdd of the differential amplifier circuit. Voltage VG, however, is not limited to this and may be any external power supply voltage of at least Vdd.

Voltage VG is at least Vth in this embodiment as described above. Here, as Vth is positive if N-type transistors N1 and N2 are of enhancement type, positive VG must be applied. If N-type transistors N1 and N2 are of depletion type, Vth is negative and thus negative VG such as ground potential and negative potential may be applied.

Second Embodiment

Figure 3:
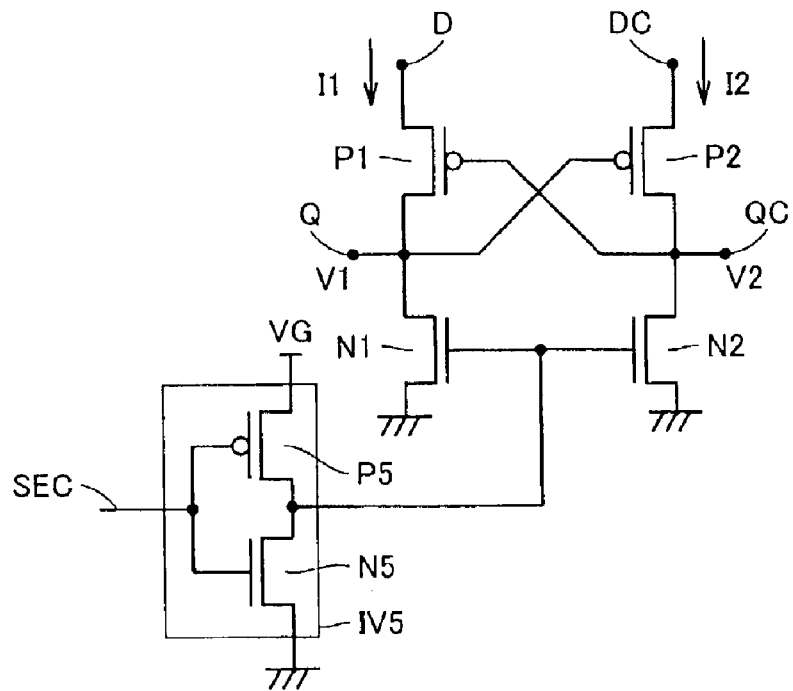
FIGS. 3 to 5 show respective configurations of differential amplifier circuits according respectively to second to fourth embodiments.

FIG. 3 shows a differential amplifier circuit according to this embodiment. The differential amplifier circuit shown in FIG. 3 includes cross-coupled P-type transistors P1 and P2 as the first embodiment shown in FIG. 1. Although the first embodiment applies a constant voltage to respective gates of N-type transistors N1 and N2, the second embodiment connects respective gates of N-type transistors N1 and N2 to a CMOS inverter circuit IV5.

This CMOS inverter circuit IV5 is constituted of an enhancement-mode P-type transistor P5 and an enhancement-mode N-type transistor N5. P-type transistor P5 has its source applied with VG and N-type transistor N5 has its source grounded. CMOS inverter circuit IV5 provides VG when the inverter circuit is supplied with a control signal SEC of L level, and provides a ground potential when supplied with control signal SEC of H level.

This differential amplifier circuit operates as discussed below.

When an amplifying operation is to be carried out, control signal SEC is externally set at L level. Then, VG is applied to respective gates of N-type transistors N1 and N2. In this way, the same amplifying operation as that shown in FIG. 1 is performed.

When the amplifying operation is not to be carried out, control signal SEC is externally set at H level. A ground potential is accordingly applied to respective gates of N-type transistors N1 and N2. N-type transistors N1 and N2 thus enter OFF state and there is no current consumption through these transistors.

According to this embodiment as discussed above, the differential amplifier circuit has its amplification factor increased as done in the first embodiment. Further, as there is no current consumption when no amplifying operation is done, power consumption is reduced.

In this embodiment, N-type transistors N1 and N2 of enhancement type are employed and thus CMOS inverter circuit IV5 supplies the ground potential as an output potential when the inverter receives control signal SEC of H level. The output potential, however, may generally be any which allows N-type transistors N1 and N2 to enter OFF state.

Third Embodiment

Figure 4:
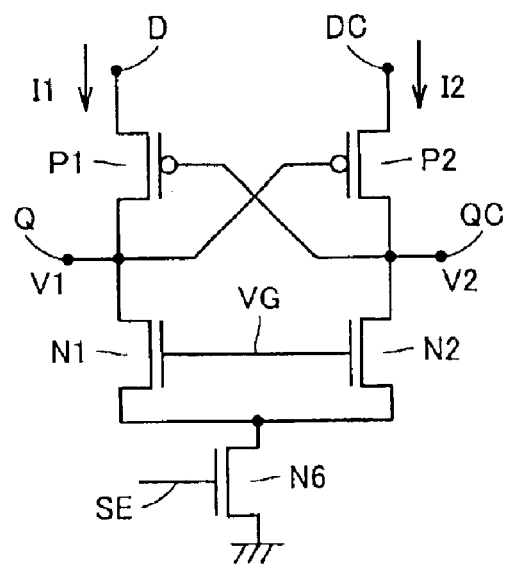

FIG. 4 shows a differential amplifier circuit according to this embodiment. The differential amplifier circuit shown in FIG. 4 includes cross-coupled P-type transistors P1 and P2 as the differential amplifier circuit of the first embodiment shown in FIG. 1. Although the differential amplifier circuit of the first embodiment shown in FIG. 1 has N-type transistors N1 and N2 with respective sources grounded, N-type transistors N1 and N2 of the third embodiment have respective sources that are not grounded but commonly connected to the drain of an enhancement-mode N-type transistor N6. Control signal SE is externally supplied to the gate of N-type transistor N6 to ground the source.

An operation of this differential amplifier circuit is described below.

When an amplifying operation is to be carried out, control signal SE is externally set at H level. Then, N-type transistor N6 enters ON state and accordingly amplification is performed as done in the first embodiment.

When no amplifying operation is to be performed, control signal SE is externally set at L level. N-type transistor N6 then enters OFF state and there is no current consumption through N-type transistor N6.

According to this embodiment as discussed above, the differential amplifier circuit has its amplification factor increased as done in the first embodiment. Further, as there is no current consumption when no amplifying operation is done, power consumption is reduced.

Fourth Embodiment

Figure 5:
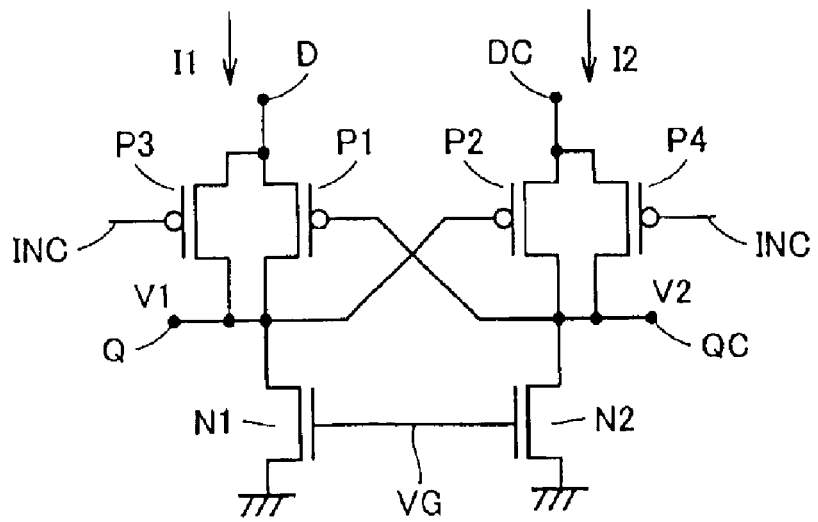

FIG. 5 shows a differential amplifier circuit according to this embodiment. The differential amplifier circuit shown in FIG. 5 includes, as the differential amplifier circuit of the first embodiment shown in FIG. 1, cross-coupled P-type transistors P1 and P2. In addition, according to this embodiment, enhancement-mode P-type transistors P3 and P4 are connected respectively in parallel with P-type transistors P1 and P2. A control signal INC is externally supplied to respective gates of P-type transistors P3 and P4.

At the start of amplification, P-type transistors P3 and P4 are made ON by this control signal INC. In the first embodiment, the route of current to N-type transistors N1 and N2 at the start of amplification is provided by only the P-type transistors P1 and P2. In this case, if voltages on output terminals Q and QC are high at the start of amplification, the drive power of P-type transistor P1 and P2 is small to hinder flow of current. In such a state, it takes a longer time for currents of different magnitudes to reach N-type transistors N1 and N2 respectively and thus takes a longer time to generate a voltage difference between paired output terminals Q and QC, resulting in a longer time required for obtaining voltage difference dV by the positive feedback.

In contrast, according to the fourth embodiment, the route of current to N-type transistors N1 and N2 is secured by P-type transistors P3 and P4 at the start of amplification in order to allow currents of different magnitudes to flow speedily to N-type transistors N1 and N2 at the start of amplification. Accordingly, a voltage difference is generated in a short period of time between paired output terminals Q and QC. Then, even if P-type transistors P3 and P4 are thereafter made OFF, a sufficient voltage difference dV' is secured between paired output terminals. Therefore, the time required for obtaining a greater voltage difference dV by the positive feedback is shortened.

Figure 6:
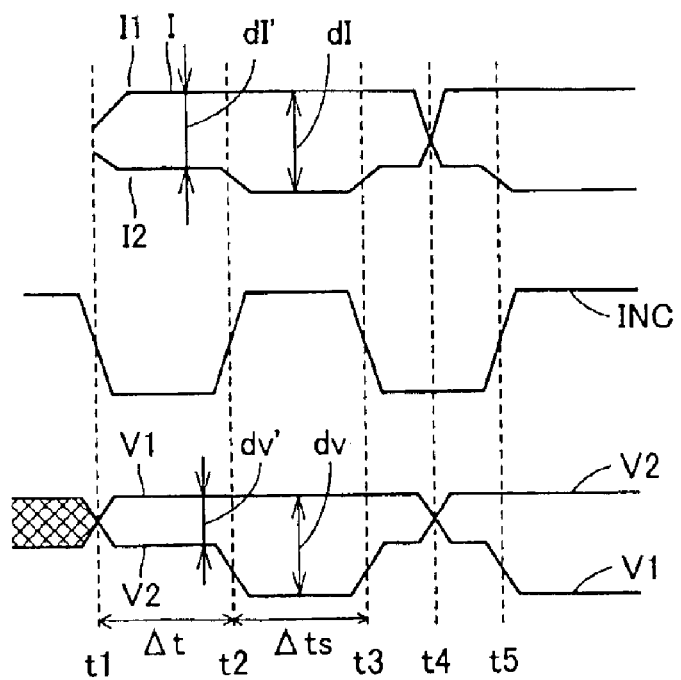
FIG. 6 is a timing chart illustrating an operation of the differential amplifier circuit according to the fourth embodiment.

An operation of the differential amplifier circuit is described with reference to the timing chart shown in FIG. 6.

At time t1, control signal INC is externally set at L level and amplification of a first stage is accordingly performed for time Δt. Here, Δt represents a period of time required for the amplification of the first stage, and is referred to as first amplification time.

Current I1 flows through P-type transistors P1 and P3 to N-type transistor N1 while current I2 flows through P-type transistors P2 and P4 to N-type transistor N2.

In this differential amplifier circuit, in contrast to the differential amplifier circuit shown in FIG. 1, current flows not only along the route through cross-coupled P-type transistors P1 and P2 but also along the route through P-type transistors P3 and P4. Then, in a stable state, current I2=I−dI'(dI'<dI) flows and this current I2 is thus greater than current I2(=I−dI) in the differential amplifier circuit in a stable state that is shown in FIG. 1. On the other hand, current I1=I here is equal to current I1 in the differential amplifier circuit in FIG. 1 in a stable state. A reason for this is that, as the drive power of P-type transistor P1 of the differential amplifier circuit in FIG. 1 in a stable state is sufficiently large and current I1 is large enough, current I1 does not change when route is expanded in the fourth embodiment here. According to such magnitudes of current, voltage V1=V is generated on output terminal Q and voltage V2=V−dV (dV'<dV) is generated on output terminal QC.

At time t2 (=t1+Δt) after the stable state, control signal INC is externally set at H level and thus amplification of a second stage is performed for time Δts. Here, Δts represents a period of time required for the amplification of the second stage, and is referred to as second amplification time. Then, P-type transistors P3 and P4 are made OFF and current I1 flows through P-type transistor P1 only to N-type transistor N1 and current I2 flows through P-type transistor P2 only to N-type transistor N2. Consequently, in the stable state, the amplification factor of the differential amplifier circuit in this embodiment is the same as that shown in FIG. 1. Specifically, voltage V1=V is generated on output terminal Q and voltage V2=V−dV is generated on output terminal QC.

At time t3 (=t2+Δts), control signal INC is externally set at L level. Then, P-type transistors P3 and P4 are made ON again and, in a stable state, the voltage on output terminal Q is V1=V and the voltage on output terminal QC returns to V2=V−dV'(dV'<dV).

At time t4, the relative relation in the magnitude of current between I1 and I2 is reversed and accordingly the relative relation in the magnitude of voltage between V1 and V2 is also reversed.

At time t5, control signal INC is externally set at H level. P-type transistors P3 and P4 are thus made OFF. Then, in a stable state, the voltage on output terminal Q is V1=V−dV and the voltage on output terminal QC is V2=V.

The differential amplifier circuit of this embodiment thus has following characteristics in addition to the characteristic that an increased amplification factor is achieved as done in the first embodiment.

At the start of amplification, P-type transistors P3 and P4 are made ON to allow current to flow quickly to N-type transistors N1 and N2 at the start of the amplification. The time required for amplification is thus shortened.

Prior to the time when the relative relation in the magnitude of current is reversed, the voltage difference is reduced to dV' so that the relative relation in the magnitude of current is reversed in a short period of time.

Fifth Embodiment

Figure 7:
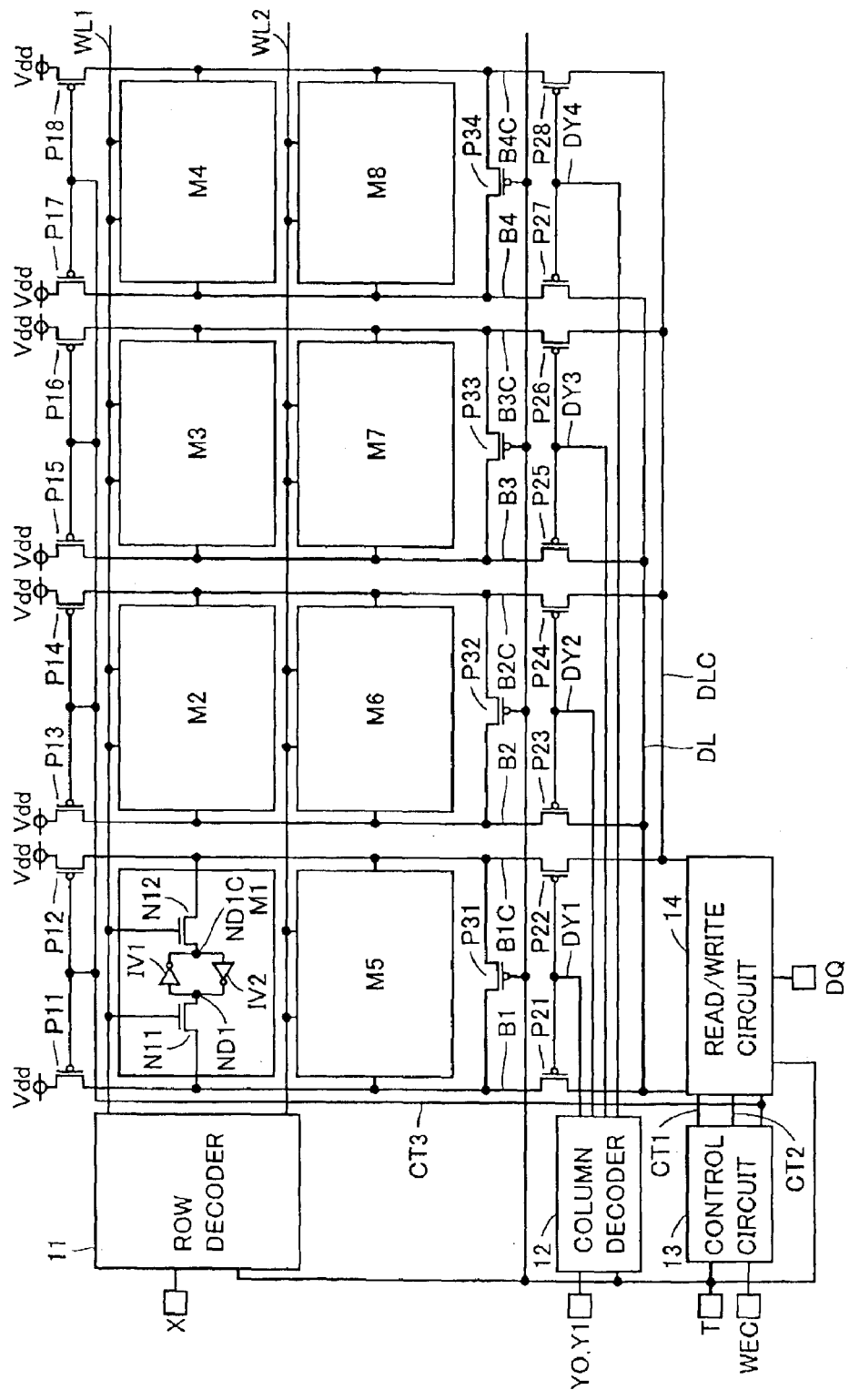
FIG. 7 shows a configuration of an SRAM according to a fifth embodiment.

FIG. 7 is a block diagram showing a configuration of an SRAM according to this embodiment.

The SRAM includes a plurality of memory cells M1–M8 arranged in rows and columns, a word line WL1 for selecting memory cells M1–M4, a word line WL2 for selecting memory cells M5–M8, a pair of bit lines B1 and B1C connected to memory cells M1 and M5, a pair of bit lines B2 and B2C connected to memory cells M2 and M6, a pair of bit lines B3 and B3C connected to memory cells M3 and M7, and a pair of bit lines B4 and B4C connected to memory cells M4 and M8.

A memory cell is constituted of a flip-flop having cross-coupled inverters IV1 and IV2 and transfer gates N11 and N12. Two storage nodes ND1 and ND1C hold a bistable state of (L, H) or (H, L). When storage node ND1 has H level and storage node ND1C has L level, 1-bit data "1" is stored in this memory cell. When storage node ND1 has L level and storage node ND1C has H level, one-bit data "0" is stored in this memory cell.

The SRAM further includes P-type load transistors P11–P18 connected to bit lines B1–B4C, P-type equalize transistors P31–P34 each connected between paired bit lines, transfer gates P21–P28 connected to bit lines B1–B4C, a pair of data lines DL and DLC connected to transfer gates P21–P28, and column selection lines DY1–DY4 connected to the gates of transfer gates P21–P28.

In addition, the SRAM includes a row decoder 11, a column decoder 12, a control circuit 13 and a read/write circuit 14.

Row decoder 11 causes any of the word lines to rise to activation level H according to externally provided address signal X and clock signal T.

Column decoder 12 causes any of column selection lines DY1–DY4 to rise to activation level L according to externally provided column address signals Y0 and Y1 and clock signal T.

Figures 8, 9:
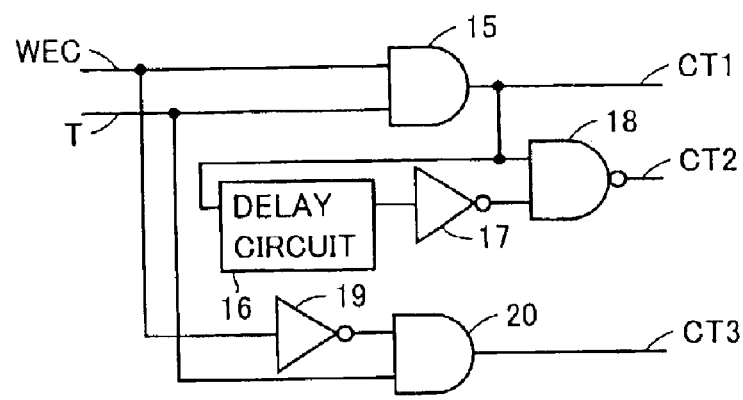
FIG. 8 shows a configuration of a control circuit.
FIG. 9 shows a relation between a signal supplied to the control circuit and a signal provided from the control circuit.

Control circuit 13 shown in FIG. 8 is constituted of an AND gate 15, a delay circuit 16, an inverter 17, a NAND gate 18, an inverter 19, and an AND gate 20. Control circuit 13 receives clock signal T and write signal WEC to provide control signals CT1, CT2 and CT3. Delay circuit 16 delays control signal CT1 by Δt and is constituted, for example, of inverters of a plurality of stages connected in series. Here, Δt represents the first amplification time described above in connection with the fourth embodiment.

FIG. 9 shows a relation between signals (T, WEC) provided to control circuit 13 and signals (CT1, CT2, CT3) provided from control circuit 13. As shown in FIG. 9, when clock signal T has H level and write signal WEC has H level, control signal CT2 stays at L level for delay time Δt generated by delay circuit 16. After time Δt, however, control signal CT2 rises to H level.

Figure 10:
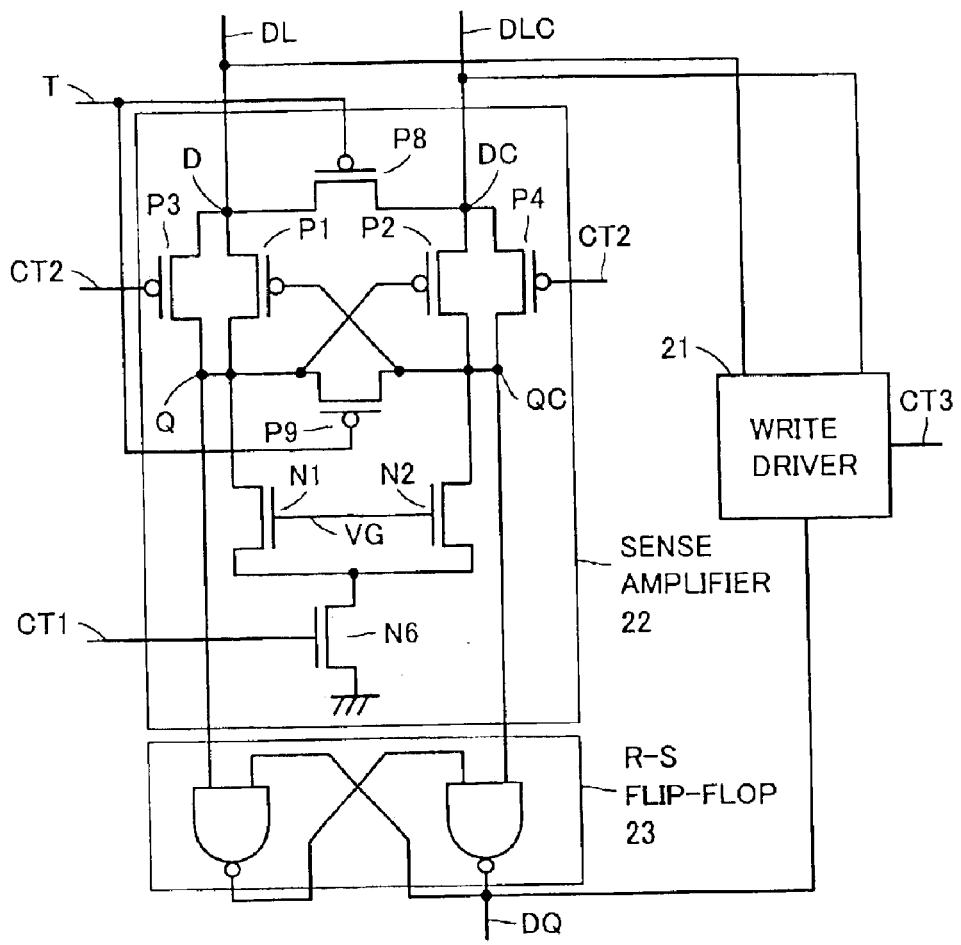
FIG. 10 shows a circuit configuration of a read/write circuit 14.

Read/write circuit 14 shown in FIG. 10 writes data into any of the memory cells according to clock signal T and control signals CT1, CT2 and CT3 and according to externally supplied input/output data signal DQ, and generates input/output data signal DQ according to data output from any of the memory cells to provide the generated signal to the outside. Read/write circuit 14 is constituted of a write driver 21, a sense amplifier 22 and an RS flip-flop 23.

Write driver 21 is activated when control signal CT3 has H level (i.e., write signal WEC has L level and clock signal T has H level). Write driver 21 is activated to set one of paired data lines DL and DLC at H level according to data input/output signal DQ and sets the other of the paired data lines at L level thereby write data into any of the memory cells.

Sense amplifier 22, which characterizes this embodiment, is a differential amplifier circuit that includes P-type transistors P1, P2, P3 and P4 and N-type transistors N1 and N2 for increasing the amplification factor and change the amplification factor step-by-step as described above in connection with the fourth embodiment and further includes an N-type transistor N6 for avoiding current consumption when no amplifying operation is performed as described above in connection with the second embodiment. In addition, sense amplifier 22 includes equalize transistors P8 and P9.

Sense amplifier 22 is controlled as detailed below by control signals CT1 and CT2 and clock signal T.

When control signal CT1 has H level (i.e., write signal WEC has H level and clock signal T has H level), amplifying operation is activated.

Control signal CT2 controls P-type transistors P3 and P4. Specifically, for time Δt for which control signal CT2 is at L level, P-type transistors P3 and P4 stay in ON state and then enter OFF state when control signal CT2 attains H level.

Transfer gates P8 and P9 are controlled by clock signal T. Specifically, when clock signal T has L level, transfer gates P8 and P9 are made ON and respective voltages on paired input terminals D and DC and paired output terminals Q and QC are equalized. When clock signal T has H level, transfer gates P8 and P9 are made OFF and amplifying operation is activated.

Current supplied to sense amplifier 22 is described below.

When data in a memory cell shown in FIG. 7 is "1", storage node ND1 has H level while storage node ND1C has L level.

In this case, most of the current flowing through bit line B1 from a power supply Vdd to load transistor P11 flows to sense amplifier 22 through transfer gate P21 and data line DL.

The current flowing from power supply Vdd to bit line B1C through load transistor P12 partially flows into memory cell M1 because of L level of storage node ND1C and the remaining current flows to sense amplifier 22 through transfer gate P22 and data line DLC.

Thus, when the data in the memory cell is "1", the current flowing through data line DL is greater in magnitude than the current flowing through data line DLC. This difference in magnitude of current is amplified and supplied by the differential amplifier circuit.

On the other hand, when data in a memory cell is "0" that is to be read from the memory cell, the current flowing through data line DLC is greater in magnitude than the current flowing through data line DL.

Sense amplifier 22 shown in FIG. 10 amplifies a difference in magnitude between currents respectively supplied from data lines DL and DLC to paired input terminals D and DC and accordingly generates voltages V1 and V2 respectively on paired output terminals Q and QC. If the current supplied from data line DL is greater in magnitude than the current from data line DLC, voltage V1 on output terminal Q and voltage V2 on output terminal QC are at H level and L level respectively because of the operation by sense amplifier 22. On the contrary, if the current supplied from data line DLC is greater in magnitude than the current from data line DL, voltage V1 on output terminal Q is L level and voltage V2 on output terminal QC is H level.

R-S flip-flop 23 provides data input/output signal DQ according to respective levels of voltages V1 and V2. Specifically, when V1 is larger than V2 (V1>V2, data in a memory cell is "1"), R-S flip-flop 23 provides data input/output signal DQ of H level. When V1 is smaller than V2 (V1<V2, data in a memory cell is "0"), flip-flop 23 provides data input/output signal DQ of L level.

Figure 11:
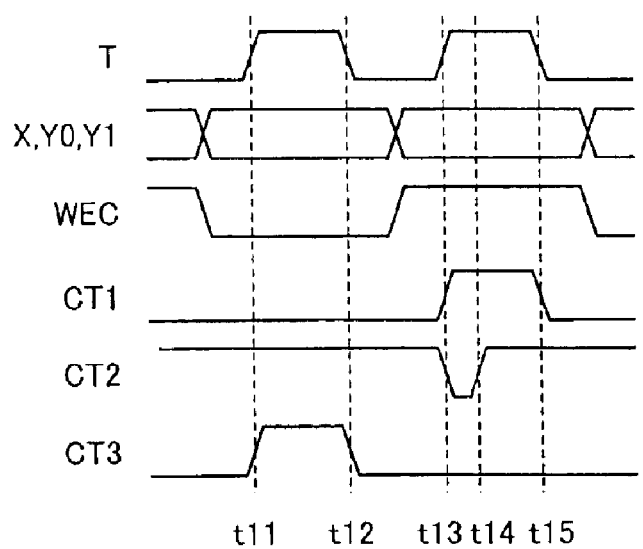
FIG. 11 is a timing chart illustrating an operation of the SRAM according to the fifth embodiment.

An operation of this SRAM is now described with reference to the timing chart shown in FIG. 11.

Write operation for a memory cell is first described. It is supposed here that data "1" is written into memory cell M1.

In writing, write signal WEC is externally set at L level.

At time t11, clock signal T is externally set at H level. As clock signal T is set at H level, equalize transistors P31–P34 are made OFF.

Row decoder 11 sets word line WL1 at H level in synchronization with clock signal T. Column decoder 12 sets column selection line DY1 at L level in synchronization with clock signal T. As word line WL1 has H level and column selection line DY1 has L level, transfer gates N11, N12, P21 and P22 are made ON and thus memory cell M1 is selected.

Control circuit 13 raises control signal CT3 to H level in synchronization with clock signal T when write signal WEC has L level. As control signal CT3 rises to H level, load transistors P11–P18 are made OFF and write driver 21 is activated.

When data input/output signal DQ of H level externally provided to write driver 21, write driver 21 applies a voltage of H level to data line DL and applies a voltage of L level to data line DLC.

At time t12, clock signal T is externally set at L level. When clock signal T is set at L level, row decoder 11 sets word line WL1 at L level, column decoder 12 sets column selection line DY1 at H level, and control circuit 13 sets control signal CT3 at L level. Accordingly, write driver 21 is inactivated, transfer gates N11, N12, P21 and P22 are made off, equalize transistors P31–P34 are made ON and thus the write operation is completed.

Read operation for a memory cell is next described.

It is supposed here that data "1" is read from memory cell M1.

Write signal WEC is externally set at H level.

At time t13, clock signal T is externally set at H level. Then, as done in the writing operation, transfer gates N11, N12, P21 and P22 are made ON and memory cell M1 is selected while equalize transistors P31–P34 are made OFF.

Control circuit 13 raises control signal CT1 to H level in synchronization with clock signal T when write signal WEC has H level. The differential amplifier circuit is accordingly activated for amplification. Control circuit 13 does not raise control signal CT3 to H level, which is different from the operation in the write operation, and thus load transistors P11–P18 are made ON.

Control circuit 13 causes control signal CT2 to fall to L level in the period of time t13–t14 (t14=t13+Δt).

Respective states of the transistors of sense amplifier 22 are generated according to the set control signals and clock signal. Equalize transistors P8 and P9 are in OFF state as clock signal T has H level. N-type transistor N6 is in ON state as control signal CT1 has H level. P-type transistors P3 and P4 are in ON state as control signal CT2 has L level. Thus, this sense amplifier 22 carries out the amplifying operation of the first stage of the two stages of the amplifying operation performed in the fourth embodiment.

At time t14, control circuit 13 sets control signal CT2 at H level. Then, P-type transistors P3 and P4 of sense amplifier 22 are made OFF. Thus, sense amplifier 22 carries out the amplifying operation of the second stage of the two stages of the amplifying operation in the fourth embodiment.

At time t15, clock signal T is externally set at L level. As clock signal T has L level, row decoder 11 sets word line WL1 at L level, column decoder 12 sets column selection line DY1 at H level, and control circuit 11 sets control signal CT1 at L level. Transfer gates N11, N12, P21 and P22 are thus made OFF, equalize transistors P31–P34 are made ON and equalize transistors P8 and P9 of sense amplifier 22 are made ON. The read operation is then completed.

The semiconductor memory device according to this embodiment as discussed above employs the differential amplifier circuit having a high amplification factor and N-type transistors N1 and N2 applied with constant voltage VG. Accordingly, the read accuracy of data in memory cells is improved.

In this differential amplifier circuit, as described in connection with the second embodiment, N-type transistor N6 is made OFF and thus there is no current consumption through the transistor in any period except for the read operation period (clock T has H level and write signal WEC has H level). Then, power consumption is reduced.

In the differential amplifier circuit, as described in connection with the fourth embodiment, P-type transistors P3 and P4 are made ON at the start of amplification and thereafter P-type transistors P3 and P4 are made OFF. Amplification is thus performed quickly.

Suppose that data is successively read from different memory cells. When the memory cells have different data, respective magnitudes of paired currents supplied to the differential amplifier circuit could be inverted. Then, before occurrence of the inversion in magnitude of paired currents, namely before switching of a memory cell to be selected, P-type transistors P3 and P4 may be returned to ON state, as done in the fourth embodiment.

Further, this embodiment employs the differential amplifier which is a combination of respective differential amplifier circuits of the second and fourth embodiments. The differential amplifier, however, is not limited to such an amplifier. The differential amplifier of the first embodiment or the third embodiment or any arbitrary combination of first to fourth embodiments may be employed.

Sixth Embodiment

Figure 12:
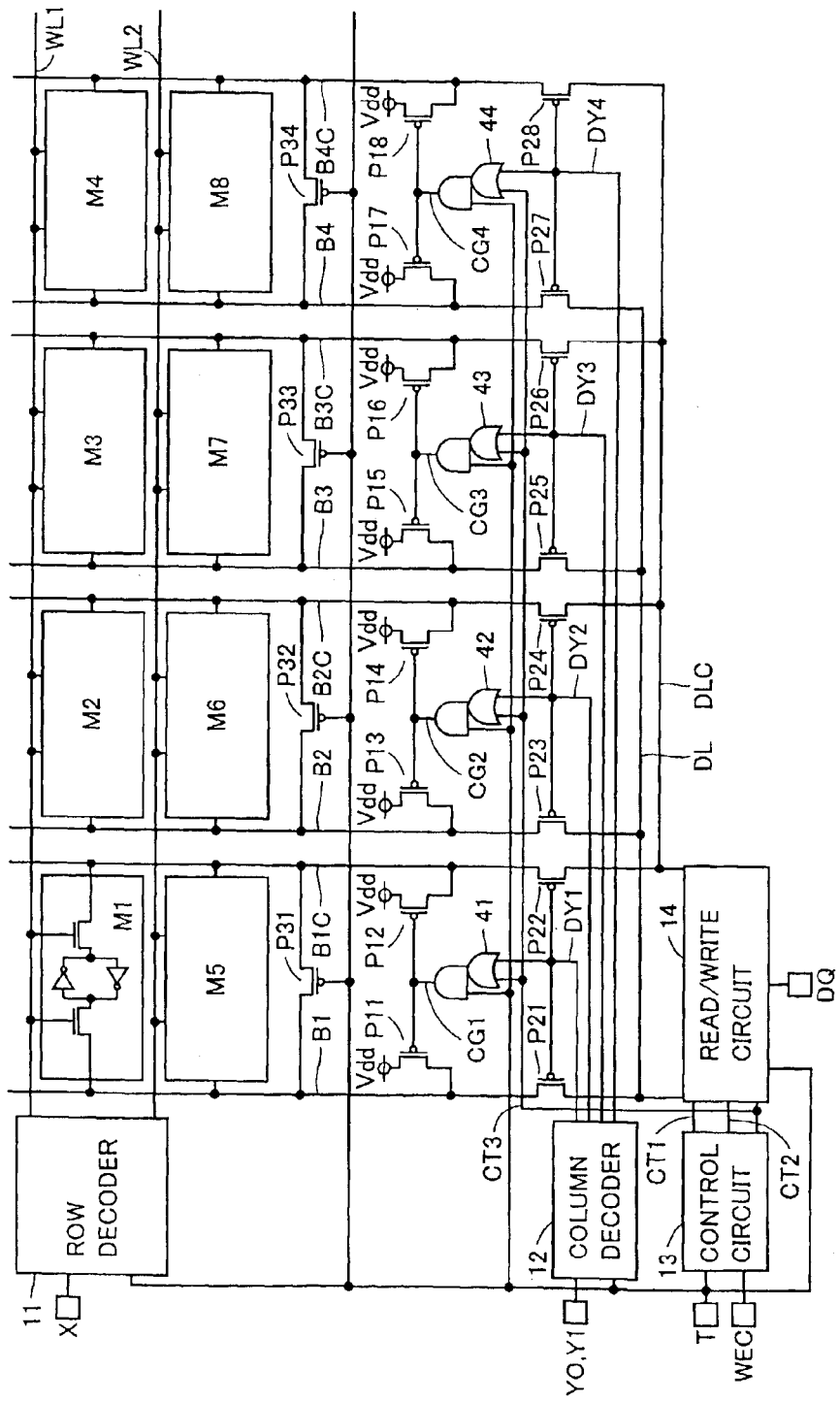
FIG. 12 shows a configuration of a semiconductor memory device according to a sixth embodiment.
Figure 13:
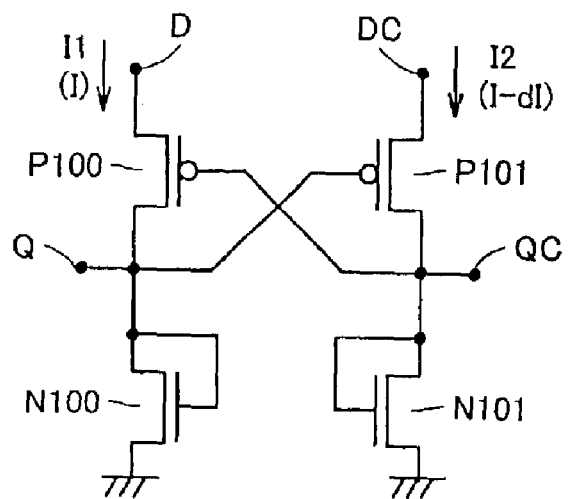
FIG. 13 shows a basic configuration of a conventional differential amplifier.

FIG. 12 shows a configuration of a semiconductor memory device according to this embodiment.

The semiconductor memory device of the sixth embodiment includes OR-AND circuits 41–44 in addition to the components of the semiconductor memory device of the fifth embodiment shown in FIG. 7.

OR-AND circuit 41 receives column selection line DY1, control signal CT3 and clock signal T to provide gate control signal CG1 to respective gates of load transistors P11 and P12. OR-AND circuit 42 receives column selection line DY2, control signal CT3 and clock signal T to provide gate control signal CG2 to respective gates of load transistors P13 and P14. OR-AND circuit 43 receives column selection line DY3, control signal CT3 and clock signal T to provide gate control signal CG3 to respective gates of load transistors P15 and P16. OR-AND circuit 44 receives column selection line DY4, control signal CT3 and clock signal T to provide gate control signal CG4 to respective gates of load transistors P17 and P18.

Operations of OR-AND circuits 41–44 and load transistors P11–P18 in writing to memory cell M1 are first described.

As discussed in connection with the fifth embodiment, for writing into memory cell M1, clock signal T and control signal CT3 are set at H level, column selection line DY1 is set at L level and column selection lines DY2–DY4 are set at H level. Then, all outputs CG1–CG4 respectively from OR-AND circuits 41–44 are at H level.

All of the load transistors P11 and P18 are accordingly made OFF. There is thus no current consumption through the load transistors in writing, and power consumption is accordingly reduced.

Operations of OR-AND circuits 41–44 and load transistors P11–P18 in reading from memory cell M1 are next described.

As discussed in connection with the fifth embodiment, in reading from memory cell M1, clock signal T is set at H level, control signal CT3 is set at L level, column selection line DY1 is set at L level, and column selection lines DY2–DY4 are set at H level. Output CG1 from OR-AND circuit 41 is thus L level and respective outputs CG2–CG4 from OR-AND circuits 42–44 are H level.

Accordingly, only load transistors P11 and P12 are made ON while other transistors P13–P18 are made OFF. Thus, in reading, only the current representing the value of data in a selected memory cell flows and no current consumption occurs except for this. Power consumption is decreased in this way.

As discussed above, the semiconductor memory device of this embodiment uses OR-AND circuits to control the gates of load transistors in order to allow only the current to flow that is requisite for representation of a data value of a memory cell. No redundant current consumption occurs and thus power consumption is decreased.

The semiconductor memory device of this embodiment has been described as the one which employs the differential amplifier circuit of the fifth embodiment (combination of respective circuits of the second and fourth embodiments). The differential amplifier of the sixth embodiment, however, may be any of other embodiments. The sixth embodiment is characterized not by the differential amplifier but by control of the load transistors, and as such, any conventional differential amplifier circuit except for those of the first to fourth embodiments may be employed in the sixth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A differential amplifier circuit comprising:
    a first input terminal and a second input terminal;
    a first output terminal and a second output terminal;
    a first P-type transistor having its source connected to said first input terminal, its drain connected to said first output terminal and its gate connected to said second output terminal;
    a second P-type transistor having its source connected to said second input terminal, its drain connected to said second output terminal and its gate connected to said first output terminal;
    a first N-type transistor having its source grounded, its drain connected to said first output terminal and its gate applied with a first potential; and a second N-type transistor having its source grounded, its drain connected to said second output terminal and its gate applied with said first potential, said first potential turning on said first N-type transistor and said second N-type transistor.

2. The differential amplifier circuit according to claim 1, further comprising:

a third P-type transistor connected in parallel with said first P-type transistor; and a fourth P-type transistor connected in parallel with said second P-type transistor, wherein a third control signal is supplied to respective gates of said third P-type transistor and said fourth P-type transistor, said third control signal has a fifth potential which turns on said third P-type transistor and said fourth P-type transistor at the start of the amplifying operation, and said third control signal has a sixth potential which turns off said third P-type transistor and said fourth P-type transistor after a first amplification period of time in which a voltage difference between said first output terminal and said second output terminal is stable.

3. The differential amplifier circuit according to claim 2, wherein said third control signal has said sixth potential and thereafter has said fifth potential after a second amplification period of time in which a voltage difference between said first output terminal and said second output terminal is stable and before relative relation in magnitude of current between a first input current from said first input terminal and a second input current from said second input terminal is reversed.

4. A semiconductor memory device comprising a sense amplifier for reading data from a memory cell, said sense amplifier including:

a first input terminal and a second input terminal;

a first output terminal and a second output terminal;

a first P-type transistor having its source connected to said first input terminal, its drain connected to said first output terminal and its gate connected to said second output terminal;

a second P-type transistor having its source connected to said second input terminal, its drain connected to said second output terminal and its gate connected to said first output terminal;

a first N-type transistor having its source grounded, its drain connected to said first output terminal and its gate applied with a first potential; and a second N-type transistor having its source grounded, its drain connected to said second output terminal and its gate applied with said first potential, said first potential turning on said first N-type transistor and said second N-type transistor.

5. The semiconductor memory device according to claim 4, wherein said sense amplifier further includes:

a third P-type transistor connected in parallel with said first P-type transistor; and a fourth P-type transistor connected in parallel with said second P-type transistor, a third control signal is supplied to respective gates of said third P-type transistor and said fourth P-type transistor, said third control signal has a fifth potential which turns on said third P-type transistor and said fourth P-type transistor at the start of the amplifying operation, and said third control signal has a sixth potential which turns off said third P-type transistor and said fourth P-type transistor after a first amplification period of time in which a voltage difference between said first output terminal and said second output terminal is stable.

6. The semiconductor memory device according to claim 5, further comprising amplification control means receiving an externally supplied clock signal and an externally supplied read/write signal for providing, when said read/write signal indicates a read instruction, a third control signal of said fifth potential for said first amplification period of time starting from rising of said clock signal and otherwise providing the third control signal of said sixth potential.

* * * * *